United States Patent
Park

(10) Patent No.: US 7,916,564 B2
(45) Date of Patent: Mar. 29, 2011

(54) MULTI-CHIP SEMICONDUCTOR DEVICE PROVIDING ENHANCED REDUNDANCY CAPABILITIES

(75) Inventor: Ki Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 12/402,660

(22) Filed: Mar. 12, 2009

(65) Prior Publication Data

US 2009/0257297 A1   Oct. 15, 2009

(30) Foreign Application Priority Data

Apr. 10, 2008   (KR) .................. 10-2008-0033084

(51) Int. Cl.
*G11C 29/00* (2006.01)
*G11C 7/06* (2006.01)
(52) U.S. Cl. .................. 365/200; 365/189.07
(58) Field of Classification Search .................. 365/200
See application file for complete search history.

(56) References Cited

U.S. PATENT DOCUMENTS

| | | | |
|---|---|---|---|
| 5,430,679 A * | 7/1995 | Hiltebeitel et al. | 365/200 |
| 5,469,390 A * | 11/1995 | Sasaki et al. | 365/200 |
| 5,831,913 A * | 11/1998 | Kirihata | 365/200 |
| 6,141,267 A * | 10/2000 | Kirihata et al. | 365/200 |
| 6,243,306 B1 * | 6/2001 | Kirihata | 365/200 |
| 6,725,414 B2 * | 4/2004 | Seyyedy | 714/773 |
| 2006/0129899 A1 * | 6/2006 | Cochran et al. | 714/718 |

FOREIGN PATENT DOCUMENTS

| | | |
|---|---|---|
| JP | 2002076240 A | 3/2002 |
| KR | 1020040106198 A | 12/2004 |
| KR | 1020070054017 A | 5/2007 |
| KR | 1020070056110 A | 5/2007 |

\* cited by examiner

*Primary Examiner* — Son L Mai
(74) *Attorney, Agent, or Firm* — Volentine & Whitt, PLLC

(57) ABSTRACT

A semiconductor device including a plurality of semiconductor chips is provided. A semiconductor device includes a storing unit in which redundancy information portions are stored, and a comparing unit comparing a current address to the redundancy information portions and enabling or disabling operation of a semiconductor device based on the comparison result.

6 Claims, 6 Drawing Sheets

MULTI-CHIP SEMICONDUCTOR DEVICE PROVIDING ENHANCED REDUNDANCY CAPABILITIES

CROSS-REFERENCE TO RELATED APPLICATION

This application claims priority under 35 U.S.C. §119 to Korean Patent Application No. 10-2008-0033084 filed on Apr. 10, 2008, the subject matter of which is hereby incorporated by reference.

BACKGROUND

The present invention relates to a semiconductor device, and more particularly to a semiconductor device capable of performing a multi-chip redundancy operation by respectively storing self-chip redundancy information and other chip redundancy information in a plurality of semiconductor chips.

Many semiconductor chips include a redundancy block (or redundancy region) used to replace (or substitute) defective memory cells identified in a larger memory block. Memory cell (or memory portion) replacement within the redundancy block is conventionally accomplished by first receiving an externally supplied address corresponding to the defective memory cell and thereafter configuring a signal path to replace the defective memory cell by such methods as laser fuse cutting, etc. In this manner, a semiconductor chip having defective memory cells may effectively be repaired. Once repaired, the semiconductor chip is operated by recognizing an applied address in relation to stored addresses associated with memory cells in the redundancy block. However, when the number of defective memory cells exceeds the number of replacement memory cells provided by the redundancy block, the semiconductor chip can not be repaired.

Many conventional subsystems and integrated circuit architectures (e.g., a multi-chip semiconductor device) include a plurality of semiconductor chips. Each one of the plurality of semiconductor chips may incorporate the foregoing effective memory cell repair capability. This possibility raises an interesting capabilities question. For example, when a first conventional semiconductor chip in a plurality of conventional semiconductor chips includes more defective memory cells than its constituent redundancy block can repair, it must be replaced within the multi-chip device, despite the fact that some other semiconductor chip in the device has unused capability within it constituent redundancy block sufficient to repair the first semiconductor chip.

SUMMARY

Embodiments of the invention provide a semiconductor device capable of providing defective memory cell redundancy capabilities as a collective of between a plurality of semiconductor chips in a multi-chip device. That is, even where a number of defective memory cells is any one semiconductor chip exceeds its constituent redundancy block capabilities, the plurality of semiconductor chips forming the multi-chip device can nonetheless provide the redundancy capabilities sufficient to preclude replacement of the excessively defective semiconductor chip.

In one embodiment, the present invention provides a multi-chip semiconductor device receiving an externally provided current address and comprising; a plurality of semiconductor chips, wherein each one of the plurality of semiconductor chips comprises; a memory arranged in a plurality of memory blocks, a storing unit configured to store redundancy information portions, and a comparing unit configured to respectively compare the current address with each one of the redundancy information portions and generate an enable signal or a disable signal based on the comparison result.

In another embodiment, the invention provides a system comprising; a microprocessor configured to generate a current address, a bus configured to communicate the current address to a plurality of semiconductor chips, wherein each one of the plurality of semiconductor chips comprises; a memory arranged in a plurality of memory blocks, a storing unit configured to store redundancy information portions, and a comparing unit configured to respectively compare the current address with each one of the redundancy information portions and generate an enable signal or a disable signal based on the comparison result.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DESCRIPTION OF EMBODIMENTS

Figure 1:
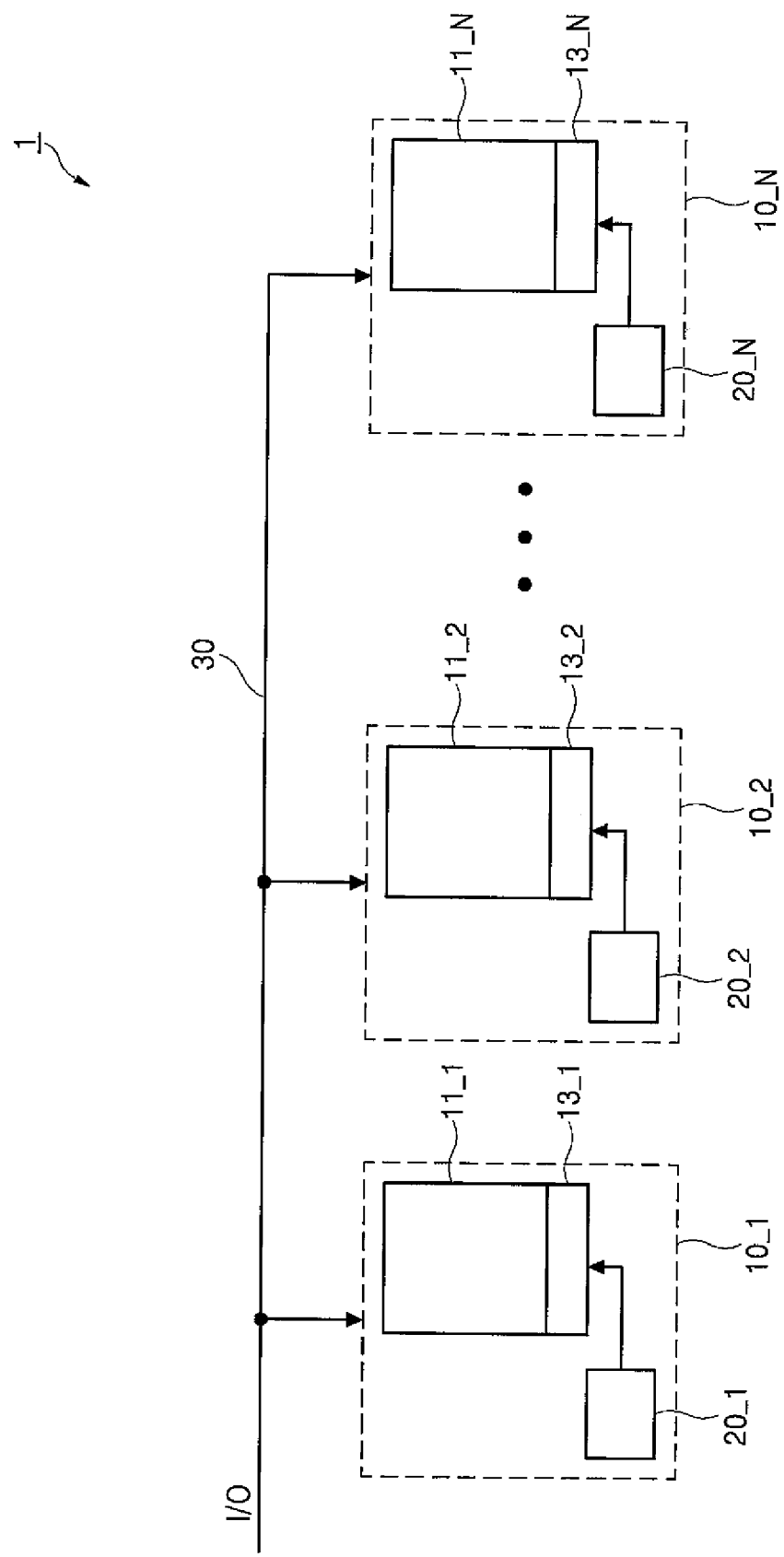
FIG. 1 is a schematic block diagram of a semiconductor device according to an embodiment of the present invention.

Reference will now be made in some additional detail to the embodiments illustrated in the accompanying drawings. The invention may however be variously embodied and should not be construed as being limited to only the illustrated embodiment. Throughout the written description and drawings, like reference numerals and indicators refer to like or similar elements.

Figure 2:
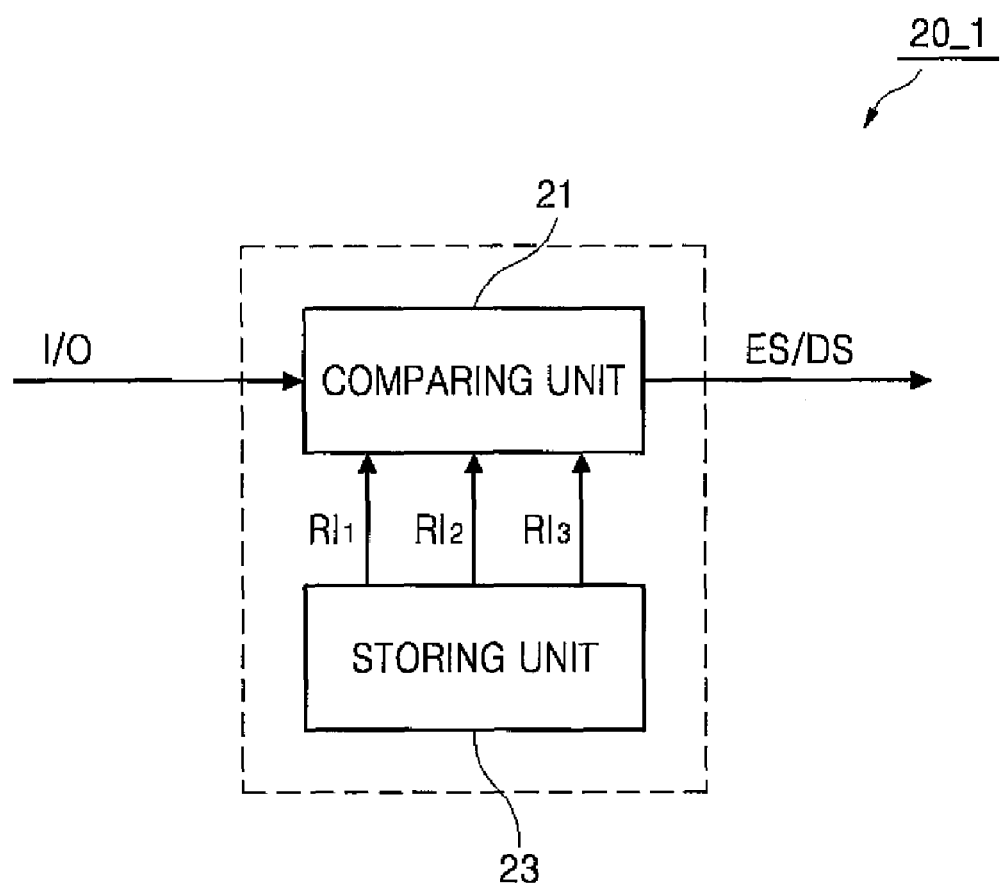
FIG. 2 is a schematic block diagram of a control unit provided in each of the plurality of semiconductor chips of FIG. 1.

Figure (FIG.) 1 is a schematic block diagram of a multi-chip semiconductor device according to an embodiment of the invention. FIG. 2 is a schematic block diagram of the control unit provided in each one of the plurality of semiconductor chips forming the multi-chip semiconductor device of FIG. 1. For the convenience of explanation, FIG. 2 illustrates only a single control unit 20_1 associated with a first semiconductor chip 10_1 illustrated in FIG. 1. However, respective control units 20_2, . . . , 20_N are similarly associated with the semiconductor chips 10_2, . . . , 10_N within the embodiment of the invention illustrated in FIG. 1, and are assumed to have substantially the same structure and operation.

Referring to FIG. 1, multi-chip semiconductor device 1 comprises a plurality of N similarly configured semiconductor chips (e.g., elements 10_1, 10_2, . . . , 10_N). Each of the plurality of semiconductor chips 10_1, 10_2, . . . , 10_N includes a respective memory region 11_1, 11-2, ..., 11-N, redundancy region 13-1, 13-2, ..., 13-N, and control unit 20-1, 20-2, ..., 20-N.

Each memory region 11_1, 11-2, ..., 11-N includes a conventionally configured plurality of memory cells arranged in a plurality of memory blocks. Address information is externally supplied (e.g., from a memory controller or microprocessor, not shown) to each semiconductor chip through a common Input/Output bus (I/O) 30. Each redundancy region 13-1, 13-2, ..., 13-N is assumed to include a plurality of redundancy blocks. Each redundancy block may be used to repair defective memory cells identified in a particular memory region, (hereafter, "a defective memory block"). In operation, when an address corresponding to the defective memory block (hereafter, "a defective address") is received by a semiconductor chip, its constituent controller causes a redundancy block to act in place of the defective memory block using conventional control and signaling techniques. Thus, data intended to be written (or programmed) to the defective memory block of an "addressed semiconductor chip" (i.e., the semiconductor chip enabled and associated with the "current" address) will instead be written to the appropriate redundancy block, where said redundancy block may be physically provided by the addressed semiconductor chip or a non-addressed semiconductor chip (i.e., one of the remaining plurality of semiconductor chips not conventionally enabled and associated with the current address within the multi-chip semiconductor device).

In the illustrated embodiment, the current address is assumed to include (or be provided with) ID information identifying the addressed semiconductor chip, and an intended memory block within the addressed semiconductor chip. The ID information may be used to enable or activate the addressed semiconductor chip, or activation may be accomplished through separate conventionally understood signaling.

Referring now to FIGS. 1 and 2, control unit 20_1 of first semiconductor chip 10_1 generally comprises a storing unit 23, and a comparing unit 21. Redundancy information (e.g., RI1, RI2, and RI3) is stored in storing unit 23. In the illustrated embodiment, a first redundancy information portion RI1 is assumed to be redundancy information allowing repair of a previously identified defective memory block within memory region 11_1 using a redundancy block located in redundancy region 13_1, (hereafter, referred to as "a constituent redundancy block"). A second redundancy information portion RI2 is assumed to be redundancy information allowing repair of the defective memory block located in memory region 11_1 of the first semiconductor chip 10_1 using a redundancy block located in the redundancy region of one of the non-addressed semiconductor chips 10_2, ..., 10_N, (hereafter, referred to as "an outgoing non-constituent redundancy block"). A third redundancy information portion RI3 is assumed to be third redundancy information that allows the repair of a defective memory block located outside of the constituent semiconductor chip (here, first semiconductor chip 10-1) using a redundancy block located in redundancy region 13_1 of first semiconductor chip 10_1, (hereafter, referred to as "an incoming non-constituent redundancy block").

Comparing unit 21 compares a current address (I/O) received from bus 30 with one or more of the redundancy information portions stored in storing unit 23, (e.g., first redundancy information portion RI1, second redundancy information portion RI2, and/or third redundancy information portion RI3), and provides a corresponding comparison result. For example, when the current address applied to first semiconductor chip 10-1 corresponds to a defective memory block located within first semiconductor chip 10_1, comparing unit 21 respectively compares the current address with each redundancy information portion RI1, RI2, and RI3.

According to the comparison result provided by comparing unit 21, when the current address corresponds with first redundancy information portion RI1, an enable signal (ES) is generated which enable the operation of first semiconductor chip 10_1. However, when the current address coincides with second redundancy information RI2, a disable signal (DS) is generated which disables operation of the first semiconductor chip 10_1. That is, since an outgoing non-constituent redundancy block associated with another one of the plurality of semiconductor chips will be used to repair the defective memory block, first semiconductor chip 10-1 is not needed.

On the other hand, when the current address is associated with a defective memory block located in another one of the plurality of semiconductor chips 10_2, ..., 10_N, comparing unit 21 will also respectively compare the current address with the redundancy information portions RI1, RI2, and RI3. According to the comparison result provided by comparing unit 21, when the current address corresponds with third redundancy information RI3, comparing unit 21 outputs the enable signal (ES), since an incoming non-constituent redundancy block associated with first semiconductor chip 10_1 will be used to repair the defective memory block.

Figure 3:
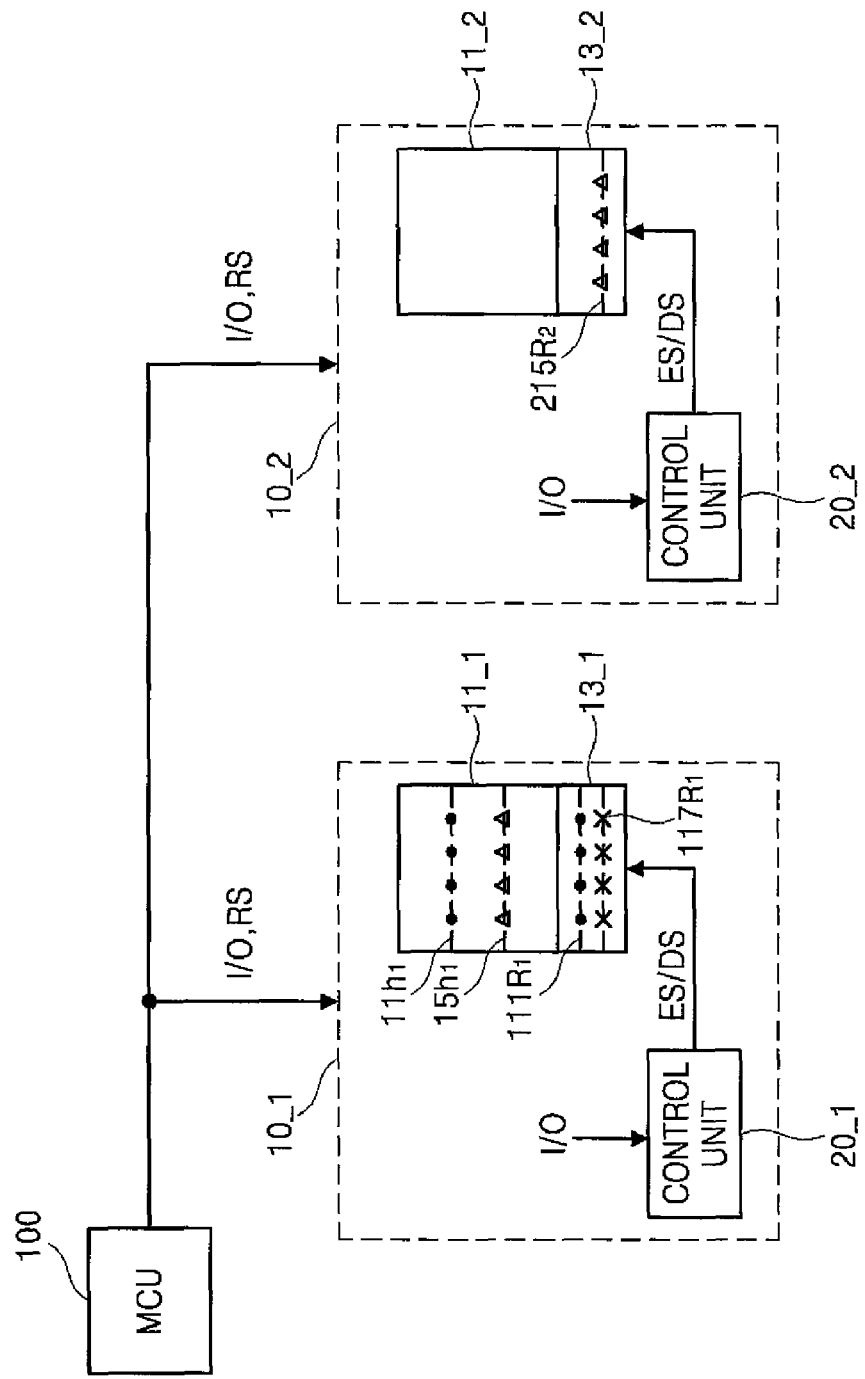
FIG. 3 conceptually illustrates operation of the semiconductor device of FIG. 1.
Figure 4:
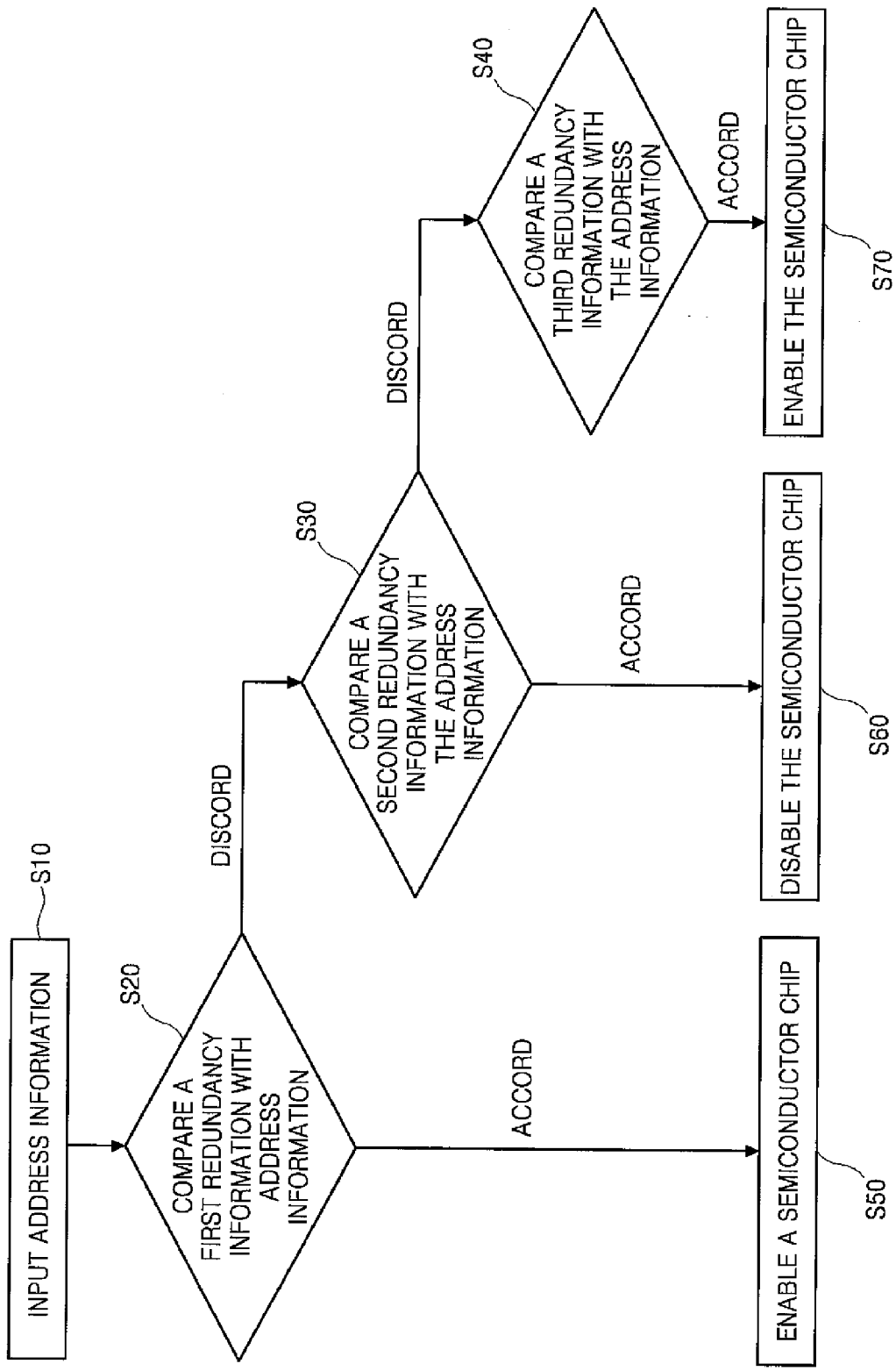
FIG. 4 is a flowchart further summarizing the operation of the semiconductor device of FIGS. 1 and 3.

Operation of the embodiment of FIGS. 1 and 2 will be further illustrated in a description of FIGS. 3 and 4. In the illustrated embodiment, a case is assumed wherein multi-chip semiconductor device 1 of FIG. 1 comprises only two semiconductor chips; a first semiconductor chip 10_1 and a second semiconductor chip 10_2. Referring to FIGS. 1 through 4, micro processor 100 supplies a first current address to first semiconductor chip 10_1 and second semiconductor chip 10_2 via bus 30 (S10).

Various redundancy information portions (e.g., RI1, RI2, and RI3 described above) have previously been stored in each storing unit 23 of first semiconductor chip 10_1 and second semiconductor chip 10_2. When the first current address is supplied to first semiconductor chip 10_1, comparing unit 21 of first semiconductor chip 10_1 respectively compares the first current address with each one of the redundancy information portions stored in storing unit 23.

For example, if a first current address corresponding to a first defective memory block 11$h$1 located in first semiconductor chip 10_1 is received, comparing unit 21 will ultimately compare the first current address with a first redundancy information portion RI1 (S20). According to the comparison result provided by comparing unit 21, when the first current address corresponds with the first redundancy information portion RI1, a first enable signal (ES) is generated to enable operation of first semiconductor chip 10_1 (S50). Thereafter, first semiconductor chip 10_1 loads (e.g.,) write data associated with the first current address into a first redundancy block 111R1 located in redundancy region 13_1 and programs the write data once loading is complete.

On the other hand, if a second current address corresponding to a second defective memory block 15$h$1 located in first semiconductor chip 10_1 is received, comparing unit 21 will ultimately compare the second current address with second redundancy information portion RI2 stored in storing unit 23 (S30). Successful comparison of the second current address with the second redundancy information portion indicates that the second defective memory block is repaired using an outgoing non-constituent redundancy block located in another one of the plurality of semiconductor chips.

In the illustrated embodiment, comparing unit 21 makes this second redundancy information portion comparison RI2 (S30) after an unsuccessful ("discord") comparison of the first redundancy information portion RI1 (S20). Upon successfully comparing the second current address with the second redundancy information RI2, comparing unit 21 generates the disable signal to disable operation of first semiconductor chip 10_1 (S60).

In the illustrated embodiment of FIGS. 3 and 4, the second redundancy information portion RI2 associated with first semiconductor chip 10_1 may be substantially the same as a third redundancy information portion RI3 associated with second semiconductor chip 10_2. In other words, the second redundancy information portion RI2 of first semiconductor chip 10_1 will indicate an outgoing non-constituent redundancy block for repairing second defective memory block 15h1 located in memory region 11_1 of first semiconductor chip 10_1, while the third redundancy information portion RI3 of second semiconductor chip 10_2 will indicate a corresponding incoming non-constituent redundancy block such that a first redundancy block 215R2 located in redundancy region 13_2 of second semiconductor chip 10_2 will be used to repair second defective memory block 15h1.

Because of this "non-constituent" repair capability within multi-chip semiconductor device 1, first semiconductor chip 10_1 is disabled and stopped (S60) in the foregoing example while second semiconductor chip 10-2 is enabled (S70) in response to the successful comparison of the second current address to third redundancy information portion RI3 stored in storing unit 23 of semiconductor chip 10_2.

Here again, in the operation of second semiconductor chip 10-2, the comparison of the second address with the third redundancy information portion RI3 (S40) only occurs after previously unsuccessful comparisons (S20 and S30) between the second current address and the respective first and second redundancy information portions associated with second semiconductor chip 10-2.

Figure 5:
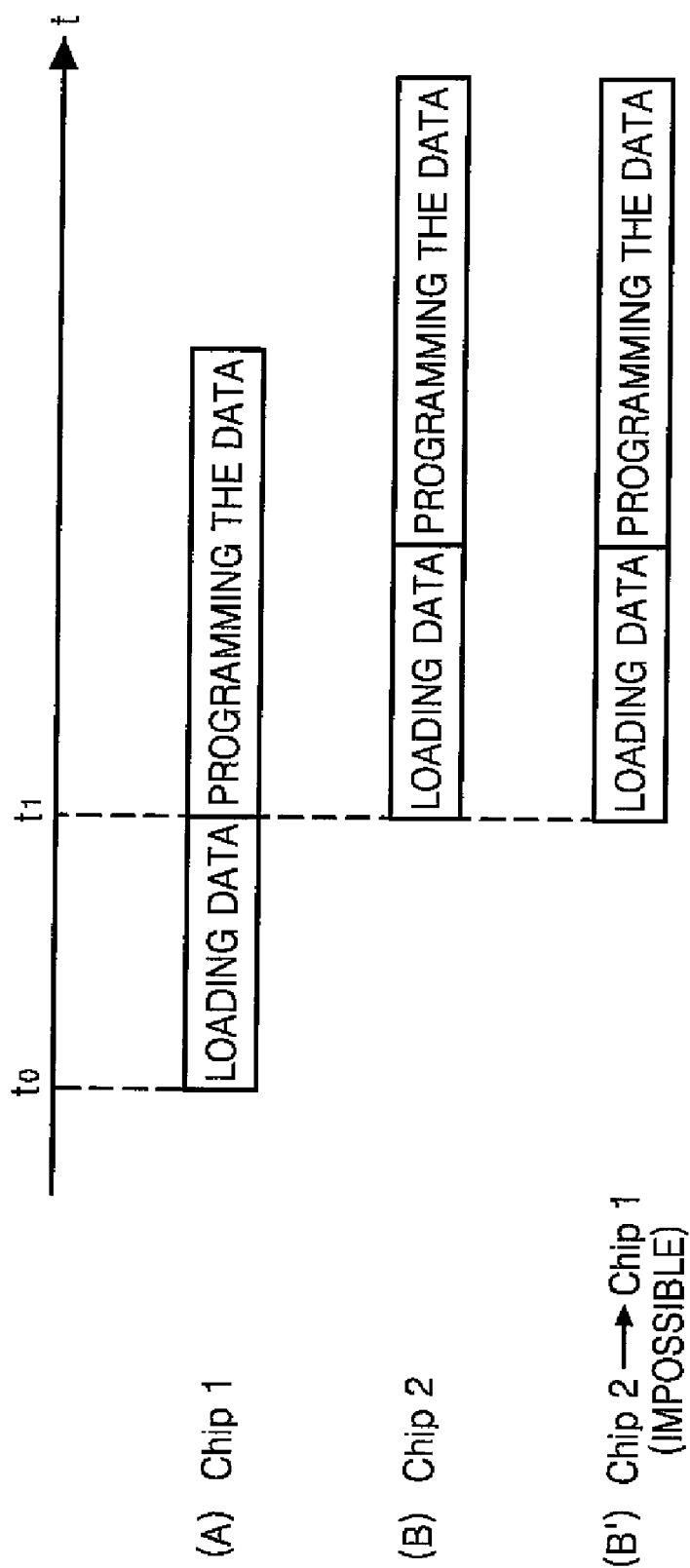
FIG. 5 is a timing drawing illustrating a conventional interleaving operation in relation to the semiconductor device of FIG. 3.
Figure 6:
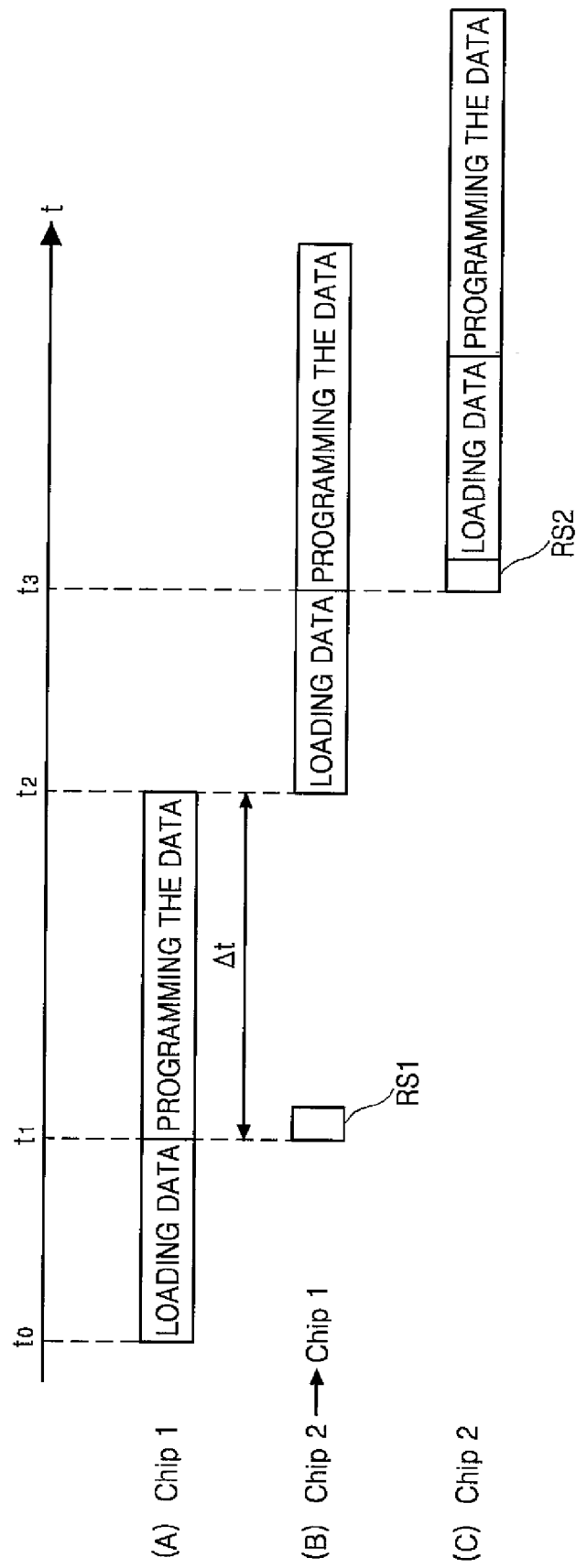
FIG. 6 is a timing drawing illustrating an interleaving operation compatible with the semiconductor device of FIG. 3 and consistent with an embodiment of the invention.

The following is an explanation of the operation of another embodiment of the invention made with reference to FIGS. 5 and 6. Referring collectively to FIGS. 3 and 5, when the first current address corresponding to first defective memory block 11h1 located in memory region 11_1 of the first semiconductor chip 10_1 is received and corresponds to the first redundancy information RI1 stored in storing unit 23 of first semiconductor chip 10_1, the first semiconductor chip 10_1 is enabled at time t0 and begins to load write data.

That is, first semiconductor chip 10_1 loads data associated with the first current address to the first redundancy block 111R1 located in redundancy region 13_1 at time t0. Once data loading is complete, a second current address is received at time t1. Here, the second address is assumed to correspond to a second defective memory block 15h in memory region 11_1 of first semiconductor chip 10_1, and consistent with the foregoing example, data associated with the second current address will be loaded to first redundancy block 215R2 located in redundancy region 13_2 of second semiconductor chip 10_2.

Microprocessor 100 may supply the second current address to second semiconductor chip 10_2 at a point in time when data associated with the first current address is completely loaded to first redundancy block 111R1 of first semiconductor chip 10_1, (i.e., at time t1). Under these circumstances, second semiconductor chip 10_2 may load data associated with the second current address to first redundancy block 215R2.

However, under other circumstances it is possible for a subsequently received current address to provoke a data load/execute conflict. For example, let us assume that at time t0 a first current address corresponding to a first defective memory block located in first semiconductor chip 10_1 results, upon proper comparison with a second redundancy information portion RI2, in data load/execution operation(s) being conducted in relation to an outgoing non-constituent redundancy block located in second semiconductor chip 10_2. Immediately thereafter at time t1, a second current address corresponding to a second defective memory block located in second semiconductor chip 10_2 results, upon proper comparison with a first redundancy information portion RI1, in data load/execution operation(s) being conducted in relation to a constituent redundancy block also located in second semiconductor chip 10_2. Such a circumstance will result in a resource collision at second semiconductor chips 10_2 at time t1.

To prevent this problem, and referring now to FIGS. 3 and 6, when a first current address corresponding to a first defective memory block 11h1 located in memory region 11_1 of first semiconductor chip 10_1, coincides with the first redundancy information RI1 stored in storing unit 23 of first semiconductor chip 10_1, then first semiconductor chip 10_1 begins operating as explained above. That is, first semiconductor chip 10_1 loads data associated the first current address at time t0. Microprocessor 100 then transmits respective state information signals RS1 and RS2 to first semiconductor chip 10_1 and second semiconductor chip 10_2 during a time period Δt sufficient to completely load the data associated with the first current address. In this manner, a second (subsequent) current address may not be received until necessary resources are available. For instance, transmission of the second current address will be held by microprocessor 100 during a hold period Δt as a result of a state information feedback signal provided by first semiconductor chip 10_1 in response to first state information signal RS1.

Using this scheme, respective semiconductor chips in a multi-chip device may be poled by state information signals, and when a potential resource conflict is identified, a following current address may be held, buffered or otherwise delayed until the potential resource conflict is ended.

That is, in relation to a semiconductor device performing a redundancy operation between semiconductor chips in a multi-chip device, a microprocessor or controller may prevent errant (resource conflict) operations within the multi-chip device by supplying a state information signal to the plurality of semiconductor chips before providing a next current address, and by holding the next current address, as needed, based on the result of the state information feedback signals provided by each of the plurality of semiconductor chips.

A multi-chip semiconductor device according to an embodiment of the invention may increase redundancy efficiency repairing a defective memory block using a non-constituent redundancy block located in another semiconductor chip.

Although embodiments of the invention have been shown and described, it will be appreciated by those skilled in the art that changes may be made in these embodiments without departing from the scope of the invention as defined by the following claims and their equivalent.

What is claimed is:

1. A multi-chip semiconductor device receiving an externally provided current address and comprising:
a plurality of semiconductor chips, wherein each one of the plurality of semiconductor chips comprises:
a memory arranged in a plurality of memory blocks;

a storing unit configured to store redundancy information portions; and a comparing unit configured to respectively compare the current address with each one of the redundancy information portions and generate an enable signal or a disable signal based on the comparison result, wherein the redundancy information portions comprise:
- a first redundancy information portion indicating a constituent redundancy block located in the memory of the semiconductor device and associated with a defective memory block in the plurality of memory blocks;
- a second redundancy information portion indicating an outgoing non-constituent redundancy block located in another one of the plurality of semiconductor chips and associated with a defective memory block in the plurality of memory blocks; and
- a third redundancy information portion indicating an incoming non-constituent redundancy block located in the semiconductor chip and associated with a defective memory block located in the memory of another one of the plurality of semiconductor chips.

2. The device of claim 1, wherein the comparing unit is further configured to generate the enable signal when successfully comparing the current address to the first redundancy information portion and the third redundancy information portion, and generate the disable signal when successfully comparing the current address to the second redundancy information portion.

3. A system comprising:
a microprocessor configured to generate a current address;
a bus configured to communicate the current address to a plurality of semiconductor chips,
wherein each one of the plurality of semiconductor chips comprises:
- a memory arranged in a plurality of memory blocks;
- a storing unit configured to store redundancy information portions; and
- a comparing unit configured to respectively compare the current address with each one of the redundancy information portions and generate an enable signal or a disable signal based on the comparison result, wherein the redundancy information portions comprise:
- a first redundancy information portion indicating a constituent redundancy block located in the memory of the semiconductor device and associated with a defective memory block in the plurality of memory blocks;
- a second redundancy information portion indicating an outgoing non-constituent redundancy block located in another one of the plurality of semiconductor chips and associated with a defective memory block in the plurality of memory blocks; and
- a third redundancy information portion indicating an incoming non-constituent redundancy block located in the semiconductor chip and associated with a defective memory block located in the memory of another one of the plurality of semiconductor chips.

4. The system of claim 3, wherein the comparing unit is further configured to generate the enable signal when successfully comparing the current address to the first redundancy information portion and the third redundancy information portion, and generate the disable signal when successfully comparing the current address to the second redundancy information portion.

5. The system of claim 4, wherein the microprocessor is further configured to load data associated with the current address in the constituent redundancy region of the first semiconductor chip upon successfully comparing the current address to the first redundancy information portion, and thereafter transmit a state information signal to each one of the plurality of semiconductor chips before transmitting a next current address.

6. The system of claim 5, wherein the microprocessor is further configured to hold transmission of the next current address in response to a state information feedback signal received in the microprocessor from one of the plurality of semiconductor chips in response in the state information signal.

* * * * *